United States Patent [19]

Yamasita et al.

[11] Patent Number: 5,246,816

[45] Date of Patent: Sep. 21, 1993

[54] CATIONIC ELECTRODEPOSITION NEGATIVE TYPE RESIST COMPOSITION

[75] Inventors: Yukio Yamasita; Toru Nakamura; Yutaka Otsuki, all of Yokohama, Japan

[73] Assignee: Nippon Oil Co., Ltd., Tokyo, Japan

[21] Appl. No.: 750,400

[22] Filed: Aug. 27, 1991

[30] Foreign Application Priority Data

Sep. 3, 1990 [JP] Japan .................................. 2-230567
Jan. 11, 1991 [JP] Japan .................................. 3-12556

[51] Int. Cl.$^5$ ............................................. G03F 7/038
[52] U.S. Cl. ................................. 430/284; 430/935; 522/96; 522/97; 204/181.7
[58] Field of Search .............................. 430/935, 284; 204/181.7; 522/96, 97

[56] References Cited

U.S. PATENT DOCUMENTS

| | | | |
|---|---|---|---|
| 3,864,133 | 2/1975 | Hitsamatsu et al. | 430/284 X |
| 4,072,536 | 2/1978 | Otsuki et al. | 204/181.7 X |
| 5,045,434 | 9/1991 | Yoshihara et al. | 430/914 X |
| 5,102,775 | 4/1992 | Okuhara et al. | 430/920 X |

*Primary Examiner*—Cynthia Hamilton
*Attorney, Agent, or Firm*—Darby & Darby

[57] ABSTRACT

A cationic electrodeposition negative type resist composition contains (A) 100 parts by weight of a resin obtained by reacting an unsaturated group-containing isocyanate compound with epoxidized liquid polybutadiene to which at least a secondary amine has been added, and (B) 0.3 to 20 parts by weight of a sensitizer.

17 Claims, No Drawings

CATIONIC ELECTRODEPOSITION NEGATIVE TYPE RESIST COMPOSITION

BACKGROUND OF THE INVENTION

This invention relates to a cationic electrodeposition negative type resist composition having high sensitivity and high resolution and hence suited for the preparation of, for example, a printed circuit board having a fine circuit pattern.

A dry film has hitherto been used extensively as an etching resist adapted for the preparation of a printed circuit board. However, since the dry film has an increased film thickness, it is poor in resolution, and the wiring pattern can not be made fine beyond a certain limit, such that the dry film can not successfully cope with refinement of the wiring pattern required for high density mounting of wiring devices in a wiring circuit board for a printed circuit employed in recent electrical and electronic equipments.

Thus, a technique of preparing a fine wiring pattern by an etching resist has been developed. The etching resist makes use of an electrodeposition coating method whereby a thin film can be coated uniformly. The electrodeposition etching resist is classified into an anionic type and a cationic type. Since an acidic solution is used for copper etching, the anionic type resist, which gives a coating film exhibiting acid resistance after curing, has been a main subject of studies and investigations.

However, the anionic electrodeposition etching resist has a drawback that, since an electrical voltage is applied during electrodeposition coating with the coated material as an anode, metal is eluated to react with carboxylic acid in the resin precipitated by electrodeposition to form salts which are difficultly soluble in an alkaline developing solution and which are mainly responsible for lowered developing properties. The anionic resist also has a drawback that, if the impressed voltage is lowered to reduce the amount of metal eluation, uniform spreadability, which is among the characteristics of the electrodeposition coating process, is lowered, so that a uniform thin film cannot be produced.

On the other hand, the cationic electrodeposition etching resist has a drawback that, although it is not subject to metal eluation because the electrical voltage is applied with the coated material as the cathode, the etching resist film before cured exhibits high tack and hence a photomask cannot be brought into tight contact therewith such that resolution as well as acid resistance of the film is markedly lowered during exposure or the coating film cannot be cured sufficiently.

SUMMARY OF THE INVENTION

It is an object of the present invention to provide a cationic electrodeposition negative type etching resist composition exhibiting high sensitivity and resolution.

It is another object of the present invention to provide a cationic electrodeposition negative type resist composition which can be applied uniformly as a thin film on a base plate and which enables the wiring pattern to be made fine.

The above and other objects of the present invention will become apparent from the following description.

According to the present invention, there is provided a cationic electrodeposition negative type resist composition containing (A) 100 parts by weight of a resin obtained by reacting an unsaturated group-containing isocyanate compound with epoxidized liquid polybutadiene to which at least a secondary amine has been added, and (B) 0.3 to 20 parts by weight of a sensitizer.

PREFERRED EMBODIMENTS OF THE INVENTION

The present invention will be explained in more detail hereinbelow.

A resin obtained by reacting an unsaturated group-containing isocyanate compound with an epoxidized liquid polybutadiene to which at least a secondary amine has been added, referred to hereinafter as component A, employed in the present invention, may be a resin having a number average molecular weight of preferably 600 to 10000 and more preferably 600 to 5000.

According to the present invention, the epoxidized liquid polybutadiene, as an ingredient of the component (A), may preferably be a compound which has a number average molecular weight preferably of 500 to 10000 and more preferably of 500 to 3000 and which is obtained by epoxidizing a liquid butadiene polymer or copolymer usually containing 50 percent or more of vinyl bonds by known methods, such as with the use of peracetic acid or hydrogen peroxide-formic acid. Commercially available epoxidized liquid polybutadiene may also be employed directly. The amount of oxirane oxygen contained in the epoxidized liquid polybutadiene may preferably be 3 to 12 wt. percent and more preferably 5 to 10 wt. percent.

The secondary amines to be added to the epoxidized liquid polybutadiene may be preferably enumerated by dialkyl amines, such as dimethyl amine, diethyl amine or dibutyl amine, and alkanol amines, such as methyl ethanol amine or diethanol amine. The secondary amines are added in such an amount that the amine value thereof is preferably 50 to 350 mmol and more preferably 70 to 250 mmol to 100 g of the epoxidized liquid polybutadiene. The amount of the secondary amines less than 50 mmol is not desirable because water solubility or dispersibility is lowered, while the amount of the secondary amines in excess of 350 mmol is also not desirable because resistance against the etching liquid after curing is lowered. The reaction of addition of the secondary amines to the epoxidized liquid polybutadiene may be carried out in a solvent containing a hydroxyl group-containing compound for 2 to 10 hours at a reaction temperature of preferably 100° C. to 200° C. and more preferably of 130° C. to 180° C. The hydroxyl group-containing compound may be preferably enumerated by alcohols, such as ethanol, isopropyl alcohol, butanol, ethylene glycol monoethyl ether, ethylene glycol monobutyl ether, ethylene glycol monohexyl ether, ethyl glycol monophenyl ether, propylene glycol monophenyl ether or methoxy butanol, and alkanol amines such as methyl ethanol amine and diethanol amine. The solvent used with these hydroxyl group-containing compounds may be preferably enumerated by toluene, dioxane, ethoxy ethyl acetate and diethylene glycol dimethyl ether. The mixing ratio between the hydroxyl group-containing compound and the solvent may be suitably determined in consideration of the kinds and the amounts of addition of the secondary amines, reaction temperature or the like.

In the component (A) employed in the present invention, acrylic acid and/or methacrylic acid, referred to hereinafter as (meth)acrylic acid, may further be added to the above mentioned epoxidized liquid polybutadiene, in addition to the secondary amine. There is no limitation to the amount of addition of (meth)acrylic acid and, if the secondary amine is added at the outset, the amount may preferably be 0 to 300 mmol and more preferably 50 to 300 mmol and most preferably 50 to 250 mmol to 100 g of the epoxidized liquid polybutadiene to which the secondary amine is added. The amount of addition in excess of 300 mmol is not desirable because gelation may be produced during the reaction of addition. There is no limitation on the sequence of the reaction of addition of secondary amine and (meth)acrylic acid. The temperature of the addition reaction of (meth)acrylic acid may preferably be 100° to 180° C., while the reaction time may preferably be 2 to 10 hours. The reaction temperature lower than 100° C. is not desirable because the reaction is unable to proceed sufficiently, whereas the reaction temperature higher than 180° C. is also not desirable because gelation is produced. The reaction of addition may be carried out using a solvent. The solvent may be enumerated by the above mentioned hydroxyl group-containing compounds, toluene, dioxane, diethylene glycol dimethyl ether and ethoxy ethyl acetate. The solvent used in the reaction of addition of the secondary amine may be directly used. The reaction of addition may preferably be carried out using polymerization inhibitors, such as hydroquinone, 2,6-di-butyl-4-methyl phenol, t-butyl catechol, p-benzoquinone, triphenyl phosphine, phenothiazine or N-nitrosophenyl amine. The amount of the polymerization inhibitor to the reaction solution in its entirety may preferably be 0.01 to 1 wt. percent. Tertiary amines or tertiary phosphines may also be added for accelerating the reaction.

The unsaturated group-containing isocyanate compound to be reacted with the epoxidized liquid polybutadiene to which at least the secondary amine is added in the component (A) may be a compound having at least one isocyanate group and at least one unsaturated group in its molecule and may preferably be a reaction product of an unsaturated monohydric alcohol with a diisocyanate compound, isocyanate ethyl methacrylate and isocyanate ethyl acrylate. The reaction product of an unsaturated monohydric alcohol with a diisocyanate compound may preferably be a compound obtained by reacting a diisocyanate compound selected from 2,4-tolylene diisocyanate, 2,6-tolylene diisocyanate, p-phenylene diisocyanate, diphenyl methane diisocyanate, 1,5-naphthylene diisocyanate, xylylene diisocyanate hydrogenated xylylene diisocyante, hexamethylene diisocyanate, isophorone diisocyanate and mixtures thereof, with an unsaturated monohydric alcohol such as 2-hydroxyethyl (meth)acrylate, 2-hydroxypropyl (meth)acrylate, a reaction product of an unsaturated carboxylic acid such as (meth)acrylic acid with a low molecular weight epoxide compound such as alkylene monoepoxide, or a compound containing an unsaturated group, such as (meth)acryloyl group and a hydroxyl group in its molecule. The charging molar ratio of the diisocyanate compound to the unsaturated monohydric alcohol may preferably be 1:1.1 to 1.5. If the charging molar ratio of the unsaturated monohydric alcohol is less than 1.1, the amount of diisocyanate compound which is left over is increased, whereas, if the ratio exceeds 1.5, the amount of isocyanate compound is undesirably reduced.

Although the reaction between the diisocyanate compound and unsaturated monohydric alcohol may proceed successfully in the absence of solvents, it is preferred to use solvents such as diethylene glycol dimethyl ether or ethoxy ethyl acetate. As for the reaction temperature for the reaction, the reaction proceeds sufficiently by heating to preferably 30° to 200° C. The reaction temperature lower than 30° C. is not desirable because the reaction time is prolonged, whereas the reaction temperature higher than 200° C. is also not desirable because gelation is produced. Tertiary amines or tin compounds may also be added for expediting the reaction.

The charging ratio between the epoxidized liquid polybutadiene with at least the aforementioned secondary amine added and the unsaturated group-containing isocyanate compound for the preparation of the component (A) used in the present invention may preferably be such that the amount of the isocyanate groups in the unsaturated group-containing isocyanate compound to 1 equivalent of the hydroxyl groups in the polybutadiene is preferably not more than 1 equivalent and most preferably 0.4 to 1 equivalent. If the relative amount of the isocyanate groups exceeds 1 equivalent, the isocyanate groups are undesirably left in the product. The reaction proceeds sufficiently satisfactorily by heating preferably to 30° to 200° C., preferably using diethylene glycol dimethyl ether, ethoxy ethyl acetate etc. as a solvent for the reaction. The temperature lower than 30° C. is not desirable because the reaction time is prolonged, whereas the temperature higher than 200° C. is also not desirable because gelation is produced. Tertiary amines or tin compounds may also be added for further expediting the reaction. If hydroxyl group-containing compounds are used for preparing epoxidized liquid polybutadiene added with the secondary amines, the hydroxyl group-containing compounds are preferably eliminated when producing the component A.

According to the present invention, conventional photopolymerization initiators, such as benzoin, benzophenone, benzoin methyl ether, benzoin ethyl ether, benzyl or Michler's ketones, may be employed as the sensitizer (B). The proportion of the sensitizer (B) is 0.3 to 20 and preferably 0.5 to 10 parts by weight to 100 parts by weight of the component (A). If the amount of the sensitizer (B) is less than 0.3 part by weight, curability falls short, whereas, if the amount exceeds 20 parts by weight, the strength of the coated film is lowered, while economic merits are lost. A photosensitizer may also be added if necessary.

In the composition of the present invention, a compound containing acryloyl group and/or methacryloyl group may also be contained as a component (C), besides the components (A) and (B), for improving fluidity of the electrodeposited film and raising the cross-linking density of the cured film. As the component (C), any monomer or oligomer having acryloyl group and/or methacryloyl group in the molecular structure and capable of being polymerized and cured by light and heat may be employed without any particular limitation. Examples of the component (C) preferably include hydroxyethyl (meth)acrylate, ethyleneglycol di(meth)acrylate, trimethylolpropane tri(meth)acrylate, pentaerythritol tri(meth)acrylate, dipentaerythritol hexa(meth)acrylate, bis(5-acryloyloxy-3-oxapentyl) phthalate, tris(acryloyloxyethyl) isocyanurate and reaction products of a low molecular weight epoxy compound and (meth)acrylic acid. These may be used alone or in combination. It is noted that, if the component (A) includes acryloyl group and/or (meth)acryloyl group, the component (A) is to be excluded. The oligomer, if used, may preferably be of a number average molecular weight of 80 to 3000 and particularly 100 to 1000. The proportion of the component (C) may preferably be 0 to 50 parts by weight and most preferably 0 to 30 parts by weight to 100 parts by weight of the component (A). The amount of the component (C) exceeding 50 parts by weight is not desirable because it becomes difficult to achieve stable dispersion in water while tack is produced in the electrodeposited film.

Additives such as solvents or pigments may also be added to the cationic electrodeposition negative type resist composition for improving or regulating its fluidity or superficial states. These solvents may be preferably enumerated by ethylene glycol monoethyl ether, ethylene glycol monobutyl ether, ethylene glycol monohexyl ether, ethylene glycol monophenyl ether, propylene glycol monophenyl ether, methoxy butanol, diethylene glycol dimethyl ether, triethylene glycol dimethyl ether, diacetone alcohol and methylethylketone. The pigments may be preferably enumerated by inorganic pigments, such as aluminum silicate, talc, titanium oxide or silica and phthalocyanic pigments aimed at coloration. The amounts of addition may be optionally determined by the electrodepositing and drying conditions, developing conditions for the subsequent developing step and the like.

When employing the cationic electrodeposition negative type resist composition, the above mentioned cationic electrodeposition negative type resist composition may preferably be used as an aqueous dispersion so as to be suited for electrodeposition. The aqueous dispersion may be prepared by an organic acid selected from formic acid, acetic acid, propionic acid and mixtures thereof in an amount of preferably 0.1 to 1.0 equivalent and more preferably 0.2 to 0.8 equivalent to one equivalent of an amino group in the component (A) for neutralizing the composition, followed by mixing, stirring and dispersion. There is no limitation to the reaction temperature for neutralization and the reaction may be carried out satisfactorily at ambient temperature. The produced aqueous dispersion may be processed by a conventional process including electrodeposition coating, drying, light exposure and development to form fine wiring patterns. Light exposure may be performed by an apparatus generating a large amount of UV rays, such as a high pressure mercury lamp, ultra high pressure mercury lamp or a metal halide lamp as a light source. Development may be performed using an acid aqueous solution, and the type or the concentration of the acids may be suitably selected as a function of the degree of refinement of the wiring pattern, development time or temperature.

Meanwhile, the composition of the present invention may also be prepared by dipping in the above solvent and forming a film by dip coating, roll coating, curtain coating or screen printing followed by light exposure and development.

The cationic electrodeposition negative type resist composition according to the present invention exhibits high sensitivity and high resolution and, since the electrodeposition coating method is used, it may be applied as a uniform thin film on a base plate. Intimate contact of a photomask may also be achieved because the pre-exposure film exhibits no tack. Thus the present composition is useful as a resist for a prined circuit board for which a fine wiring pattern is required.

EXAMPLES OF THE INVENTION

The present invention will be explained in more detail with reference to several Examples. It will be noted that these Examples are not intended for limiting the invention.

SYNTHESIS EXAMPLE 1

Synthesis of Epoxidated Liquid Polybutadiene Added with Amide 1000 g of epoxidized liquid polybutadiene, manufactured and sold by NIPPON PETROCHEMICALS CO. LTD. under the trade name of E-1000-8, with a number average molecular weight of 1000 and an oxirane oxygen amount of 8%, were charged into a separable flask with a capacity of 2 lit. fitted with a thermometer, a stirrer and a cooling tube. After the atmosphere in the system is replaced by nitrogen, 231.2 g of methyl ethanol amine were added and reaction was carried out at 170° C. for five hours. Non-reacted methyl ethanol amine was distilled off under a reduced pressure to give an epoxidized polybutadiene added with an amine with an amine value of 230.4 mmol/100 g, referred to hereinafter as a compound (a-1).

Synthesis of Unsaturated Group-Containing Isocyanate Compound 435.5 g of 2,4-tolylene diisocyanate and 266.1 g of diethylene glycol dimethyl ether were charged into a round-bottomed flask with a capacity of 1000 ml which was fitted with a thermometer, a stirrer, a cooling tube and a dropping funnel and which might thus be heated and cooled. After heating to 40° C., 362.8 g of 2-hydroxyethyl acrylate were added dropwise from the dropping funnel. At this time, 200 ppm of p-benzoquinone were also added. Since heat was evolved by the dropwise addition of 2-hydroxyethyl acrylate, the reaction system was occasionally cooled and maintained at 40° C. After termination of the dropwise addition of 2-hydroxyethyl acrylate, the temperature of the reaction system was raised to 70° C., at which temperature reaction was carried out for three hours. After it had been confirmed by the IR absorption spectrum analysis that the intensity of absorption proper to the isocyanate groups was lowered to about one half that before the start of the reaction, the reaction system was cooled to give an unsaturated group-containing isocyanate compound, referred to hereinafter as a compound (a-2).

Synthesis of Component (A-1)

500 g of the compound (a-1) were dissolved in 166.7 g of diethylene glycol dimethylether in a 2000 ml separable flask. 713.4 g of the compound (a-2), containing 0.8 equivalent of isocyanate groups to 1 equivalent of the hydroxyl group in the compound (a-1), were added dropwise at 40° C., at which temperature reaction was carried out for 30 minutes. An IR absorption spectrum analysis had revealed that the isocyanate groups had disappeared. A compound which is an addition compound of the compounds (a-1) and (a-2), referred to hereinafter as a component (A-1), was produced.

SYNTHESIS EXAMPLE 2

Synthesis of Epoxidized Polybutadiene Added with Amine and Acrylic Acid 1000 g of epoxidized liquid polybutadiene, manufactured and sold by NIPPON PETROCHEMICALS CO., LTD. under the trade name of E-1800-6.5 with a number average molecular weight of 1800 and an oxirane oxygen amount of 6.5%, and 264 g of ethylene glycol monobutyl ether, were charged into a 2 lit. autoclave. After the atmosphere within the system was replaced by nitrogen, 57.2 g of dimethylamine were added, and reaction was carried out at 160° C. for five hours. After the pressure in the reaction system was set to an ambient pressure, non-reacted dimethylamine was distilled off to produce a resin solution added with dimethylamine. The amine value and the solids concentration in the resin solution were 92.2 mmol/100 g and 80 wt. %, respectively.

To 1000 g of the produced resin solution were then added 115.3 g of acrylic acid, 5.6 g of hydroquinone and 3.3 g of triphenyl phosphine, and the resulting mixture was reacted at 135° C. for 3.5 hours. Ethylene glycol monobutyl ether and non-reacted acrylic acid were then distilled off in vacuum to give epoxidized polybutadiene added with amine and acrylic acid, referred to hereinafter as a compound (a-3).

Synthesis of Unsaturated Isocyanate Compound 348.4 g of 2,4-tolylene diisocyanate and 258.8 g of diethylene glycol dimethyl ether were charged into a round-bottomed flask with a capacity of 1000 ml which was fitted with a thermometer, a stirrer, a cooling tube and a dropping funnel and which might thus be heated and cooled. After heating to 50° C., 255.4 g of 2-hydroxyethyl acrylate were added dropwise from the dropping funnel. At this time, 100 ppm of p-benzoquinone were also added. Since heat was evolved by the dropwise addition of 2-hydroxyethyl acrylate, the reaction system was occasionally cooled and maintained at 50° C. After termination of the dropwise addition of 2-hydroxyethyl acrylate, the temperature of the reaction system was raised to 70° C., at which temperature reaction was carried out for three hours. After it had been confirmed by the IR absorption spectrum analysis that the intensity of absorption proper to the isocyanate groups was lowered to about one half that before the start of the reaction, the reaction system was cooled to give an unsaturated isocyanate compound, referred to hereinafter as a compound (a-4).

Synthesis of Compound (A-2)

500 g of the compound (a-3) were dissolved in 214.3 g of diethylene glycol dimethyl ether and 500 g of the compound (a-4) containing 0.9 equivalent of isocyanate groups to 1 equivalent of hydroxyl groups in the compound (a-3), were added dropwise at 40° C., at which temperature reaction was carried out for 30 minutes. It was then confirmed by an IR absorption spectrum analysis that absorption proper to the isocyanate groups disappeared. A compound which is an addition compound of the compounds (a-3) and (a-4), referred to hereinafter as (A-2) component, was produced.

SYNTHESIS EXAMPLE 3

Synthesis of Epoxidized Polybutadiene Added with Amine and Acrylic Acid 1000 g of epoxidized liquid polybutadiene, manufactured and sold by NIPPON PETROCHEMICAL CO., LTD. under the trade name of E-1000-8, with a number average molecular weight of 1000 and an oxirane oxygen amount of 8%, and 282 g of ethylene glycol monobutyl ether, were charged into an autoclave with a 2 lit. capacity. After the system was replaced by nitrogen, 127.0 g of dimethyl amine were added to a reaction system, and reaction was carried out at 160° C. for 5 hours. The pressure of the reaction system was set to an ambient pressure and non-reacted dimethyl amine was distilled off. Ethylene glycol monobutyl ether was also distilled off in vacuum to produce a resin added with amine. The amine value of the resin was 230.0 mmol/100 g.

To 500 g of the produced resin were then added 54.1 g of acrylic acid, 2.7 g of hydroquinone, 1.7 g triphenyl phosphine and 237.5 g of diethylene glycol dimethyl ether, and the resulting mass was reacted at 135° C. for 3.5 hours to give epoxidized polybutadiene added with amine and acrylic acid, referred to hereinafter as a compound (a-5).

Synthesis of Unsaturated Isocyanate Compound 348.4 g of 2,4-tolylene diisocyanate and 273.7 g of diethylene glycol dimethyl ether were charged into a round-bottomed flask with a capacity of 1000 ml which was fitted with a thermometer, a stirrer, a cooling tube and a dropping funnel and which might thus be heated and cooled. After heating to 50° C., 290.3 g of 2-hydroxyethyl acrylate were added dropwise from the dropping funnel. At this time, 100 ppm of p-benzoquinone were also added. Since heat was evolved by the dropwise addition of 2-hydroxyethyl acrylate, the reaction system was occasionally cooled and maintained at 50° C. After termination of the dropwise addition of 2-system was raised to 70° C., at which temperature reaction was carried out for three hours. After it had been confirmed by the IR absorption spectrum analysis that the intensity of absorption proper to the isocyanate groups was lowered to about one half that before the start of the reaction, the reaction system was cooled to give an unsaturated group-containing isocyanate compound, referred to hereinafter as a compound (a-6).

Synthesis of Compound (A-3)

750 g of the compound (a-5) and 729.2 g of the compound (a-6) in which compound (a-6) 1 equivalent of the isocyanate groups corresponds to 1 equivalent of the hydroxyl groups in the compound (a-5), were reacted in the same way as in Synthesis Example 1 to produce a compound which was the compound (a-6) added to the compound (a-5) and which is referred to hereinafter as a component (A-3).

SYNTHESIS EXAMPLE 4

Synthesis of Epoxidized Polybutadiene Added with Amine and Acrylic Acid 1000 g of epoxidized liquid polybutadiene, manufactured and sold by NIPPON PETROCHEMICALS CO., LTD. under the trade name of E-1800-8, and 264 g of ethylene glycol monobutyl ether, were charged into a 2 lit. autoclave. After the atmosphere within the system was replaced by nitrogen, 57.2 g of dimethylamine were added, and reaction was carried out at 160° C. for six hours. After the reaction was carried out at 160° C. for six hours. After the pressure in the reaction system was set to an ambient pressure, non-reacted dimethylamine was distilled off and ethylene glycol monobutyl ether was then distilled off in vacuum to produce an amine added resin. The amine value of the resin was 115 mmol/100 g.

To 500 g of the produced resin were then added 126.1 g of acrylic acid, 3.1 g of hydroquinone, 1.8 g of triphenyl phosphine and 270.4 g of diethylene glycol dimethyl ether, and reaction was carried out at 135° C. for four hours. The reaction mass exhibited an acute increase in viscosity. Epoxidized polybutadiene added with amine and acrylic acid, referred to hereinafter as component (A-4), was produced.

EXAMPLE 1

To 500 g of the component (A-1), produced in the Synthesis Example 1 were added 27.0 g of an initiator manufactured and sold by CIBA-GEIGY AG under the trade name of IRGACURE 907, referred to hereinafter as "IRGACURE 907", 3.0 g of a photosensitizer manufactured and sold by NIPPON KAYAKU CO. LTD. under the trade name of KAYACURE DETX, referred to hereinafter as "KAYACURE DETX", and 16.7 g of acetic acid as a neutralizing agent, and the reaction mass was stirred and homogenized sufficiently. 195 g of de-ionized water were added gradually to the reaction system and the resulting mass was mixed vigorously and dispersed in water to produce an aqueous solution of a cationic electrodeposition negative type etching resist having a solids concentration of 15 wt. %.

EXAMPLE 2

To 500 g of the component (A-1), produced in Synthesis Example 1, were added 37.5 g of tris(acryloyloxyethyl) isocyanurate, manufactured and sold by TOA GOSEI CHEMICAL INDUSTRY CO., LTD. under the trade name of ARONIX M-315, as a component (C), 27.0 g of "IRGACURE 907" as an initiator, 3.0 g of "KAYACURE DETX" as a photosensitizer, 36.7 g of ethylene glycol monobutyl ether and 16.7 g of acetic acid as a neutralizing agent, and the resulting mass was sufficiently stirred and neutralized. As 2255.1 g of de-ionized water were added gradually to the reaction system, the resulting product was mixed vigorously and dispersed in water to produce an aqueous solution of a cationic electrodeposition negative type etching resist having a solids concentration of 15 wt. %.

EXAMPLE 3

To 500 g of the component (A-2), produced in Synthesis Example 2, were added 25.2 g of "IRAGACURE 907" as an initiator, 2.8 g of "KAYACURE DETX" as a photosensitizer and 10.1 g of acetic acid as a neutralizing agent, and the resulting mass was sufficiently stirred and homogenized. 1795 g of de-ionized water were gradually added to the reaction system, and the resulting mass was mixed vigorously by a high speed mixer and dispersed in water to produce an aqueous solution of a cationic electrodeposition negative type etching resist having a solids concentration of 15 wt. %.

EXAMPLE 4

To 500 g of the component (A-3) produced in Synthesis Example 3 were added 25.2 g of "IRGACURE 907" as an initiator, 2.8 g of "KAYACURE DETX" as a photosensitizer and 11.3 g of acetic acid as a neutralizing agent, and the resulting mass was sufficiently stirred and homogenized. As 1795 g of de-ionized water were gradually added to the reaction system, the resulting product was mixed vigorously by a high speed mixer and dispersed in water to produce an aqueous solution of a cationic electrodeposition negative type etching resist having a solids concentration of 15 wt. %.

EXAMPLE 5

To 500 g of the component (A-3), produced in Synthesis Example 3, were added 35.0 g of "ARONIX M-315" manufactured and sold by TOA COSEI CHEMICAL INDUSTRY CO., LTD., as a component C, 27.2 g of "IRGACURE 907" as an inntiator, 3.1 g of "KAYACURE DETX" as a photosensitizer and 16.9 g of acetic acid as a neutralizing agent. As 1984 g of de-ionized water were added gradually to the reaction system, the reaction mass was stirred vigorously by a high-speed mixer and dispersed in water to produce an aqueous solution of a cationic electrodeposition negative type etching resist.

COMPARATIVE EXAMPLE 1

500 g of the compound (a-1) produced in Synthesis Example 1 were dissolved in 166.7 g of diethylene glycol dimethyl ether. To the resulting solution were added 36 g of "IRGACURE 907" as an initiator, 4.0 g of "KAYACURE DETX" as a photosensitizer and 34.6 g of acetic acid as a neutralizing agent, and the resulting mixture was stirred and homogenized thoroughly. As 2592 g of de-ionized water were added gradually to the reaction system, the reaction mass was mixed vigorously with a high-speed mixer and dispersed in water to produce a cationic electrodeposition negative type etching resist with a solids concentration of 15 wt. %.

COMPARATIVE EXAMPLE 2

To 500 g of the compound (a-3), produced in Synthesis Example 2 were added 36 g of "IRGACURE 907" as an initiator, 4.0 g of "KAYACURE DETX" as a photosensitizer and 24.1 g of acetic acid as a neutralizing agent, and the resulting mass was thoroughly stirred and homogenized. As 2769 g de-ionized water were added gradually to the reaction system, the resulting mass was stirred vigorously by a high-speed mixer. The resulting mixture was dispersed in water to produce an aqueous solution of a cationic electrodeposition negative type etching resist with a solids concentration of 15 wt. %.

COMPARATIVE EXAMPLE 3

To 500 g of the component (A-4) produced in Synthesis Example 4 were added 25.2 g of "IRGACURE 907" as an initiator, 2.8 g of "KAYACURE DETX" as a photosensitizer and 21.3 g of acetic acid as a neutralizing agent, and the resulting mass was throughly stirred and homogenized. As 1784 g of de-ionized water were added gradually to the reaction system, the resulting mass was mixed vigorously by a high-speed mixer and dispersed in water to produce an aqueous solution of a cationic electrodeposition negative type etching resist having a solids concentration of 15 wt. %.

TEST EXAMPLE 1

Each of the aqueous solutions of the cationic electrodeposition negative type resists produced in Examples 1 to 5 and Comparative Examples 1 to 3 was charged into a stainless steel beaker of a 2 lit. capacity and electrodeposition coating was performed using a laminated plate having one side lined with copper as a cathode and the beaker as an anode to produce a uniform coating film. After the film was dried at 80° C. for ten minutes, a photomask was placed in tight contact therewith, and UV rays were irradiated thereon using a UV exposure device having a high pressure mercury lamp "JL-3300"

manufactured and sold by ORC MANUFACTURING CO., LTD with each UV dosage shown in Table 1, to check properties thereof as a photoresist. The results are shown in Table 1. Development was carried out for one minute in a 0.25 wt. % aqueous solution of lactic acid under the same development conditions. Possible presence of tack of each dried coating film was checked in accordance with the finger touch dryness feel determination as prescribed in JIS K 5400, with respect to a coating surface cooled to ambient temperature. The conditions of electrodeposition and the results of measurement are shown in the following Table 1.

Etching Conditions: ferric chloride solution (Baume 45°, TSURUMI SODA CO., LTD.).

Liquid Temperature, 30° C.; Liquid Pressure, 3 kg/cm$^2$; Etching Time, 60 second.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

TABLE 1

|  |  | Ex. 1 | Ex. 2 | Ex. 3 | Ex. 4 | Ex. 5 | Comp. Ex. | | |
|---|---|---|---|---|---|---|---|---|---|
|  |  |  |  |  |  |  | 1 | 2 | 3 |
| Electro- | Voltage (V) | 120 | 130 | 40 | 40 | 80 | 100 | 50 | 50 |
| deposition | Current | 3 | 3 | 3 | 3 | 1 | 3 | 3 | 3 |
| Coating | Conduction |  |  |  |  |  |  |  |  |
| Conditions | Time (Min.) |  |  |  |  |  |  |  |  |
| Film Thickness ($\mu$m) |  | 15 | 15 | 15 | 15 | 14 | 16 | 14 | 15 |
| Presence or Absence of Tack of Coating Film after Drying at 80° C. for 10 min. |  | Non | Non | Non | Non | Non | Present | Present | Non |
| Light Exposure Amount (mJ/cm$^2$) |  | 200 | 150 | 200 | 150 | 100 | 200 | — | 500 |
| Number of Step Tablet Stages |  | 10 | 14 | 10 | 10 | 12 | 0 | — | 8 |
| Resolution (Line Width) ($\mu$m) |  | 80 | 30 | 80 | 50 | 50 | — | — | 200 |

It is seen from the results shown in Table 1 that, if the resin to which only a secondary amine was added was used as a component (A), the coating film after electrodeposition and drying exhibited tack such that a photomask could not be placed in tight contact therewith. When a polyethylene terephthalate film 40 $\mu$m in thickness was interposed between the coating film and the photomask and the resulting assembly was exposed to light, the polyethylene terephthalate film could not be peeled from the coating film successfully, while the coating film was cured only insufficiently and still exhibited tack such that the coating film surface was dissolved in its entirety on development (Comparative Examples 1 and 2). If the amount of acrylic acid was increased, synthesis was rendered difficult due to increase in viscosity at the time of addition. Although the problem of tack could be eliminated, the coating film was inferior in sensitivity and resolution and hence was not practically usable because the unsaturated isocyanate compound was not involved in the reaction system (Comparative Example 3).

However, if a resin in which the unsaturated isocyanate compound was involved in the reaction, as in Examples 1 to 5, was used, the coating film after electrodeposition coating and drying exhibited no tack and a photoresist excellent in sensitivity and resolution could be produced. It was also found that addition of a suitable amount of a compound having acryloyl and/or metacryloyl groups led to formation of a film with high sensitivity and high resolution with no tack.

TEST EXAMPLE 2

Etching tests were conducted under the following conditions on the laminated plate obtained in Test Example 1 by light exposure and development. The resist film exhibited high withstanding properties, and a fine pattern faithful to the resist film was obtained.

Etching Apparatus: "Special Type MODEL VE-20", manufactured by KIMURA ETCHING INC.

What is claimed is:

1. A resist composition for making a cationic electrodeposition negative photoresist wherein said resist composition comprises (A) 100 parts by weight of a resin obtained by reacting an unsaturated group-containing isocyanate compound with epoxidized liquid polybutadiene with which at least a secondary amine has been reacted, and (B) 0.3 to 20 parts by weight of a photosensitizer.

2. The composition according to claim 1 wherein said secondary amine is selected from the group consisting of dimethyl amine, diethyl amine, dibutyl amine, methyl ethanol amine, diethanol amine and mixtures thereof.

3. The composition according to claim 1 wherein an amount of addition of said secondary amine is 50 to 350 mmol to 100 g of the epoxidized liquid polybutadiene.

4. The composition according to claim 1 wherein said epoxidized liquid polybutadiene has a number average molecular weight of 500 to 10000.

5. The composition according to claim 1 wherein an amount of oxirane oxygen in said epoxidized liquid polybutadiene is 3 to 12 wt. %.

6. The composition according to claim 1 wherein a compound selected from the group consisting of acrylic acid, methacrylic acid and mixtures thereof is reacted with said epoxidized liquid polybutadiene.

7. The composition according to claim 6 wherein an amount of addition of said compound is up to 300 mmol to 100 g of said epoxidized liquid polybutadiene.

8. The composition according to claim 1 wherein said unsaturated group-containing isocyanate compound is selected from the group consisting of isocyanate ethyl methacrylate, isocyanate ethyl acrylate and mixtures thereof.

9. The composition according to claim 1 wherein said unsaturated group-containing isocyanate compound is obtained by reacting a diisocyanate compound selected from the group consisting of 2,4-tolylene diisocyanate, 2,6-tolylene diisocyanate, p-phenylene diisocyanate, diphenyl methane diisocyanate, 1,5-naphthylene diisocyanate, xylylene diisocyanate, hydrogenated xylylene diisocyanate, hexamethylene diisocyanate, isophorone diisocyanate and mixtures thereof, and an unsaturated monohydric alcohol selected from the group consisting of a reaction product of (meth)acrylic acid with alkylene monoepoxide, 2-hydroxyethyl (meth)acrylate, 2-hydroxypropyl (meth)acrylate and mixtures thereof.

10. The composition according to claim 9 wherein a charging molar ratio of said diisocyanate compound to said unsaturated monohydric alcohol is 1:1.1 to 1.5.

11. The composition according to claim 1 wherein a charging ratio at the time of reaction of said epoxidized liquid polybutadiene with said unsaturated group-containing isocyanate compound is such that not more than 1 equivalent of isocyanate groups in said unsaturated group-containing isocyanate compound is present in a reaction system to 1 equivalent of hydroxyl groups in said epoxidized liquid polybutadiene.

12. The composition according to claim 1 wherein a number average molecular weight of said resin is 600 to 10000.

13. The composition according to claim 1 wherein said photosensitizer (B) is selected from the group consisting of benzoin, benzophenone, benzoin methyl ether, benzoin ethyl ether, benzyl, Michler's ketones and mixtures thereof.

14. The composition according to claim 1 further comprising (C) a (meth)acryloyl group-containing compound having a group selected from the group consisting of an acryloyl group, a methacryloyl group and mixtures thereof.

15. The composition according to claim 14 wherein said (meth)acryloyl group-containing compound is selected from the group consisting of hydroxyethyl (meth)acrylate, ethyleneglycol di(meth)acrylate, trimethylolpropane tri(meth)acrylate, pentaerythritol tri(meth)acrylate, dipentaerythritol hexa(meth)acrylate, bis(5-acryloyloxy-3-oxapentyl) phthalate, tris(acryloyloxyethyl) isocyanurate, and mixtures thereof.

16. The composition according to claim 14 wherein said (meth)acryloyl group-containing compound is an oligomer obtained by reacting a low molecular weight epoxy compound with (meth)acrylic acid.

17. The composition according to claim 16 wherein a number average molecular weight of said oligomer is 80 to 3000.

* * * * *